United States Patent
Wang et al.

(10) Patent No.: US 10,121,801 B2
(45) Date of Patent: Nov. 6, 2018

(54) TFT ARRAY SUBSTRATE AND MANUFACTURING METHOD THEREOF, AND DISPLAY DEVICE

(71) Applicants: Shanghai AVIC Optoelectronics Co., Ltd., Shanghai (CN); Tianma Micro-Electronics Co., Ltd., Shenzhen (CN)

(72) Inventors: Yanli Wang, Shanghai (CN); Shoufu Jian, Shanghai (CN)

(73) Assignees: SHANGHAI AVIC OPTOELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/229,725

(22) Filed: Mar. 28, 2014

(65) Prior Publication Data

US 2015/0035167 A1    Feb. 5, 2015

(30) Foreign Application Priority Data

Jul. 30, 2013    (CN) .......................... 2013 1 0326789

(51) Int. Cl.
| | |
|---|---|
| *H01L 27/12* | (2006.01) |
| *H01L 21/768* | (2006.01) |
| *H01L 23/522* | (2006.01) |
| *G02F 1/1362* | (2006.01) |
| *G02F 1/1333* | (2006.01) |

(52) U.S. Cl.
CPC ...... *H01L 27/124* (2013.01); *G02F 1/136286* (2013.01); *H01L 21/76895* (2013.01); *H01L 23/5226* (2013.01); *G02F 2001/133388* (2013.01); *H01L 2924/0002* (2013.01)

(58) Field of Classification Search
CPC ......... G02F 1/1345; G02F 1/1343; G02F 1/13
See application file for complete search history.

(56) References Cited

U.S. PATENT DOCUMENTS

| | | | |
|---|---|---|---|
| 2005/0162363 A1* | 7/2005 | Kim ..................... | G09G 3/3614 345/92 |
| 2010/0045918 A1* | 2/2010 | Han et al. ..................... | 349/149 |
| 2012/0154308 A1* | 6/2012 | Jeon .................... | G02F 1/13338 345/173 |
| 2014/0078032 A1* | 3/2014 | Xia ..................... | G09G 3/3648 345/92 |

FOREIGN PATENT DOCUMENTS

CN           101770125 A      7/2010

* cited by examiner

*Primary Examiner* — Fernando L Toledo
*Assistant Examiner* — Lawrence-Linh T Nguyen
(74) *Attorney, Agent, or Firm* — Alston & Bird LLP (57) ABSTRACT

The present invention provides a TFT array substrate, the TFT array substrate includes: a first metal layer including a first common electrode line, a second metal layer including a second common electrode line, and a third common electrode line, wherein the third common electrode line is electrically connected with at least one of the first common electrode line and the second common electrode line. The TFT array substrate provided by the present invention can achieve at least one effect of reducing the delay of a common electrode line signal (common signal), reducing flicker inequality and crosstalk without reducing the aperture ratio, lowering the cost and simplifying the manufacturing process.

11 Claims, 7 Drawing Sheets

TFT ARRAY SUBSTRATE AND MANUFACTURING METHOD THEREOF, AND DISPLAY DEVICE

CROSS-REFERENCES TO RELATED APPLICATIONS

This application claims the benefit of priority to Chinese Patent Application No. 201310326789.5, filed with the Chinese Patent Office on Jul. 30, 2013 and entitled "TFT ARRAY SUBSTRATE AND MANUFACTURING METHOD THEREOF, AND DISPLAY DEVICE", the content of which is incorporated herein by reference in its entirety.

TECHNICAL FIELD

The present invention relates to the technical field of display, in particular to a TFT array substrate and a manufacturing method thereof, and a display device including the TFT array substrate.

BACKGROUND OF THE INVENTION

At present, flat panel displays, such as LCDs (Liquid Crystal Displays), occupy a dominant position in the flat panel display market due to characteristics such as small volume, light weight, thin, low power consumption, no radiation, and the like. In an imaging process, each liquid crystal pixel point in an LCD flat panel display is driven by a thin film transistor (TFT) integrated in a TFT array substrate and is cooperated with a peripheral drive circuit to display images, and the TFT is a switch controlling luminescence, is a key point of realizing large sizes of liquid crystal displays and OLED (Organic Light Emitting Diode) displays and is directly related to the development direction of high-performance flat panel displays. With higher and higher requirements on resolution of products, in the TFT substrate structure, how to reduce delay of the common electrode line signal (common signal), reduce flicker inequality and crosstalk without reducing the aperture ratio and improve the display quality becomes a problem to be urgently solved by those skilled in the art.

BRIEF SUMMARY OF THE INVENTION

In view of this, the present invention provides a TFT array substrate and a manufacturing method thereof, and a display device including the TFT array substrate.

A TFT array substrate includes a display area and a non-display area, wherein the display area includes a first metal layer including a first common electrode line, and a second metal layer including a second common electrode line; and the non-display area includes a third common electrode line, and the third common electrode line is electrically connected with at least one of the first common electrode line and the second common electrode line.

Correspondingly, the present invention further provides a method for manufacturing the TFT array substrate, the method includes: forming a first metal layer including a first common electrode line in a display area; forming a second metal layer including a second common electrode line on the first metal layer; and forming a third common electrode line in a non-display area.

Correspondingly, the present invention further provides a display device, including the abovementioned TFT array substrate, and a color filter substrate arranged to be opposite to the TFT array substrate, wherein a transparent common electrode is arranged on one side of the color filter substrate, the side of the color filter substrate faces to the TFT array substrate.

Compared with the prior art, the present invention has at least one of the following outstanding advantages.

According to the TFT array substrate and the manufacturing method thereof, and the displace device of the present invention, the first common electrode line is arranged in the first metal layer (in the same layer as a gate line), and the second common electrode line is arranged in the second metal layer (in the same layer as a data line), so that a certain number of data lines can be decreased, the second common electrode line is arranged by smartly utilizing the decreased certain number of data lines in the present invention so as not to reduce the aperture ratio, moreover, since the third common electrode line is electrically connected with at least one of the first common electrode line and the second common electrode line, so that in the gate line driving process, the TFT array structure can realize current conduction in the longitudinal direction (data line direction) and the transverse direction (gate line direction) so as to at least reduce the delay of common electrode line signal (common signal), reduce flicker inequality and crosstalk and improve the display quality; and the cost of a source drive (not shown in the figures) is higher than that of a gate drive (not shown in the figures), and a certain number of data lines are decreased, so that the number of the source drives is decreased, and as a result, at least one of the advantages of lowering the manufacturing cost and simplifying the process flow can be achieved.

BRIEF DESCRIPTION OF THE DRAWINGS

FIG. 5($a$) is a schematic diagram of a structure of a manufacturing process of the TFT array substrate in the fourth embodiment of the present invention;

FIG. 5($b$) is a schematic diagram of a structure of a manufacturing process of the TFT array substrate in the fourth embodiment of the present invention;

FIG. 5($c$) is a schematic diagram of a structure of a manufacturing process of the TFT array substrate in the fourth embodiment of the present invention.

DETAILED DESCRIPTION OF THE PREFERRED EMBODIMENTS

In order to make the abovementioned objective, characteristics and advantages of the present invention become more clearly, a further illustration is made below to the present invention in combination with drawings and embodiments.

It should be noted that in the following description, specific details are set forth to fully understand the present invention. However, the present invention can also be implemented by multiple manners different from the described implementations, and those skilled in the art can make similar extension without departing from the conception of the present invention. Therefore, the present invention is not limited to the following disclosed specific implementations.

Figure 1:
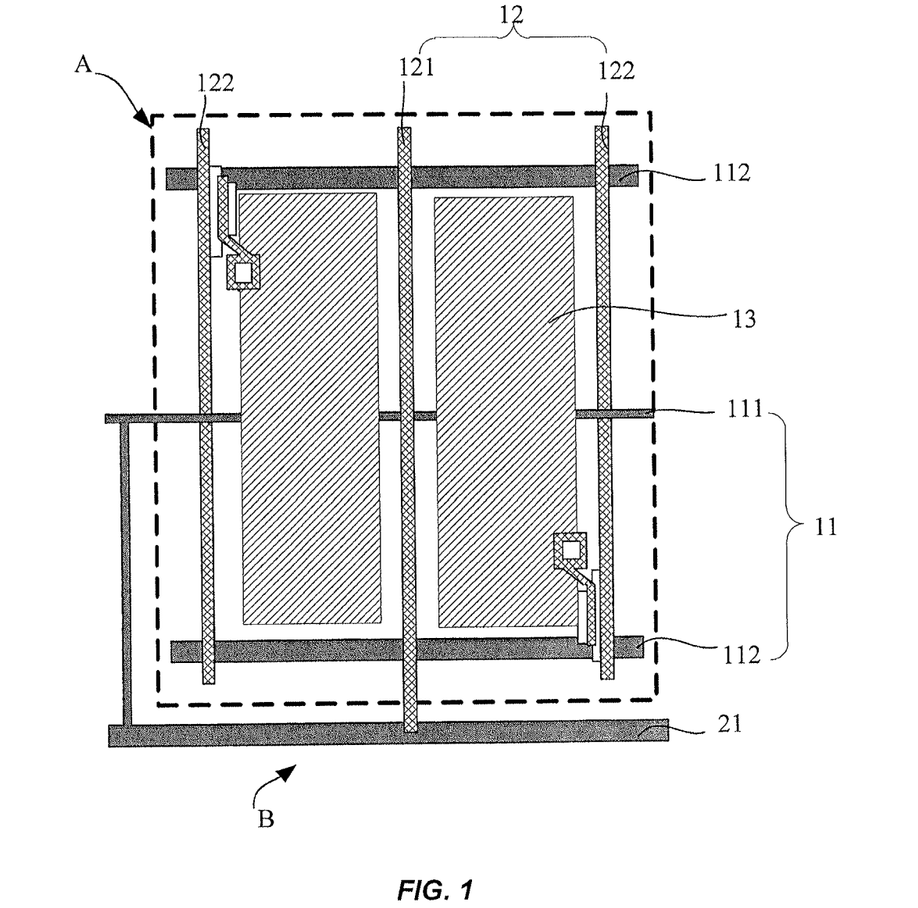
FIG. 1 is a schematic diagram of a structure of a TFT array substrate in an embodiment of the present invention.

In an embodiment, as shown in FIG. 1, the present invention provides a TFT array substrate including a display area A and a non-display area B. The display area A includes: a first metal layer 11 including a first common electrode line 111, and a second metal layer 12 including a second common electrode line 121; the non-display area B includes a third common electrode line 21 used for providing a common signal, and the third common electrode line 21 is electrically connected with the first common electrode line 111, the third common electrode line 21 is electrically connected with the second common electrode line 121, and the first common electrode line 111 is not electrically connected with the second common electrode line 121.

The first metal layer 11 further includes a gate line 112, the gate line 112 is of a double-gate-line structure, and the gate line 112 is separated from the first common electrode line 111, namely, the gate line 112 is not intersected with the first common electrode line 111 so as to achieve an insulation purpose. The first common electrode line 111 is not limited to a straight line or a curved line, and in this embodiment, the first common electrode line 111 is a straight line and is parallel to the gate line 112; the second metal layer 12 further includes a data line 122, and the data line 122 is separated from the second common electrode line 121, namely, the data line 122 is not intersected with the second common electrode line 121 so as to achieve an insulation purpose. The second common electrode line 121 is not limited to a straight line or a curved line, and in this embodiment, the second common electrode line 121 is a straight line and is parallel to the data line 122.

In this embodiment, although the first common electrode line 111 and the second common electrode line 121 are located in different layers, the wiring shape of the first common electrode line 111 and the second common electrode line 121 forms a plurality of connected rectangular frames on the plane in an overlooking angle and represents the shape of a net on the whole.

In this embodiment, the TFT array substrate further includes pixel electrodes 13 located on the second metal layer 12, since the double-gate-line structure is adopted, the number of the pixel electrodes 13 in each row is set to be larger than or equal to twice of the number of the second common electrode lines 121. Under this principle, those skilled in the art can adaptively set the number of the pixel electrodes 13 and the number of the second common electrode lines 121 according to actual demands, respectively.

In this embodiment, the material of the first metal layer 11 and the second metal layer 12 can be selected according to different device structures and process requirements, the generally adopted metal is a single-layer structure of Mo, Cr, W, Ti, Ta, Mo, Al or Cu, or a composite structure composed of any combination of two or more of Cr, W, Ti, Ta, Mo, Al and Cu, and the thickness is generally 200-350 nm. The pixel electrode 13 can be made of transparent materials such as indium tin oxide, aluminum zinc oxide, indium zinc oxide, tin oxide, indium oxide, indium gallium oxide, zinc oxide and the like.

In this embodiment, since the double gateline 112 structure is adopted, the number of the data lines 122 can be decreased to half. The second common electrode line 121 is arranged by smartly utilizing the space originally occupied by the decreased data lines 122 in the present invention so as not to reduce the aperture ratio. Furthermore, the first common electrode line 111 is electrically connected with the third common electrode line 21 to receive the common signal, the second common electrode line 121 is electrically connected with the third common electrode line 21 to receive the common signal, the delay of the common signal can be avoided by the net-shaped wiring of the first common electrode line 111 and the second common electrode line 121, so that multiple defects caused by the delay of the common signal can be avoided, and the display quality is improved. Furthermore, since the cost of the source drive (not shown in the figures) is higher than that of the gate drive (not shown in the figures) and the number of the data lines is decreased in this embodiment, the number of the source drives is correspondingly decreased, and as a result, the manufacturing cost is lowered.

Figure 2:
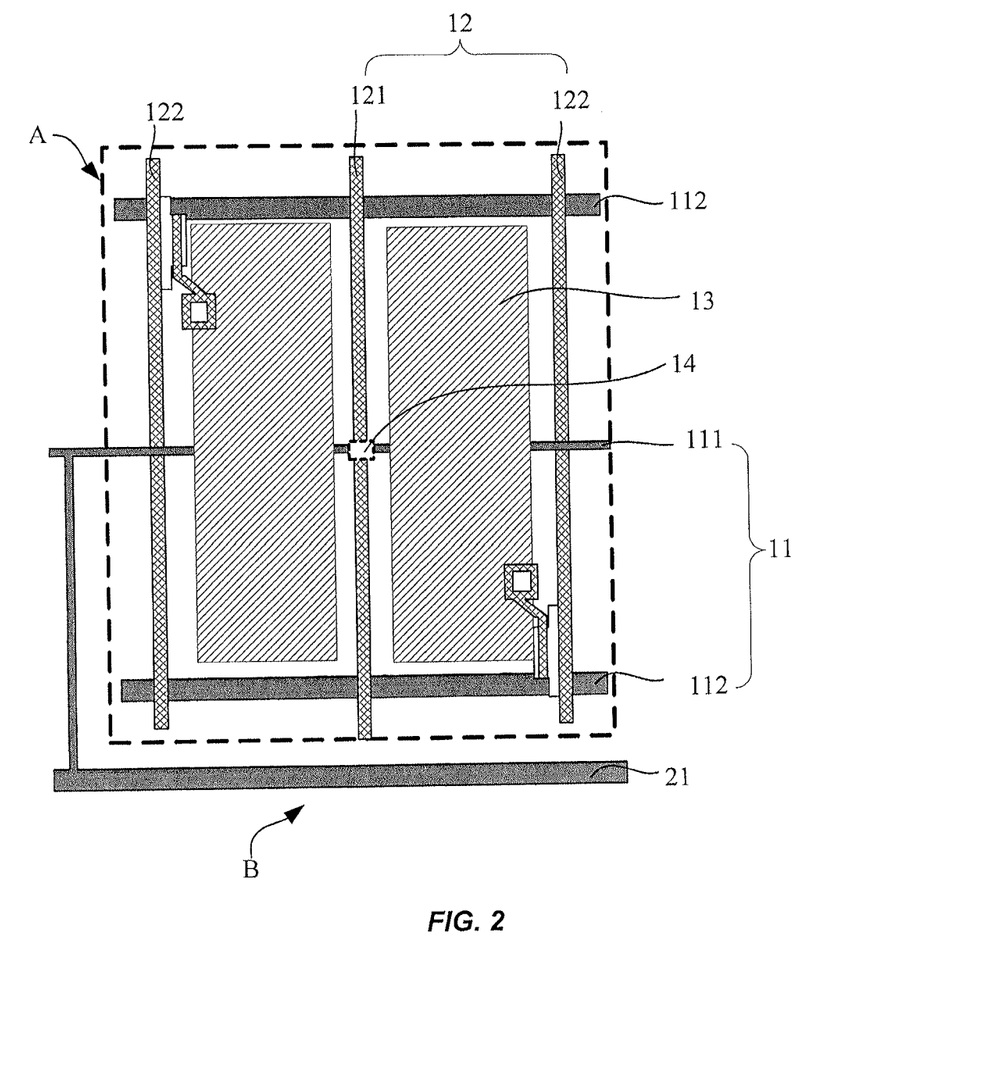
FIG. 2 is a schematic diagram of a structure of a TFT array substrate in another embodiment of the present invention.

In another embodiment, the TFT array substrate in the above embodiment is partially modified, the repeated parts will be omitted, and the difference between this embodiment and the above embodiment lies in the connection relationship among the first, second and third common electrode lines. As shown in FIG. 2, the first common electrode line 111 is electrically connected with the second common electrode line 121 through a via hole 14, and the first common electrode line 111 is also electrically connected with the third common electrode line 21, but the second common electrode line 121 is not connected with the third common electrode line 21.

In this embodiment, the TFT array substrate further includes an insulating layer (not shown in the figures) located between the first metal layer 11 and the second metal layer 12, wherein the first and second common electrode lines are electrically connected through the via hole 14 penetrating through the insulating layer, and the insulating layer is of a composite structure composed of any combination of two or more of silicon oxide, silicon oxynitride and silicon nitride.

In this embodiment, the first and second common electrode lines are electrically connected through the via hole 14 penetrating through the insulating layer, and the first common electrode line 111 is electrically connected with the third common electrode line 21, but the second common electrode line 121 is not connected with the third common electrode line 21, yet the first and second common electrode lines can receive the common signal from the third common electrode line, and the delay of the common signal can be avoided by the net-shaped wiring of the first common electrode line 111 and the second common electrode line 121, so that multiple defects caused by the delay of the common signal can be avoided without reducing the aperture ratio, and the display quality is improved. Furthermore, since the number of the data lines is decreased in this embodiment, the number of the source drives is correspondingly decreased, so that the manufacturing cost is lowered.

Figure 3:
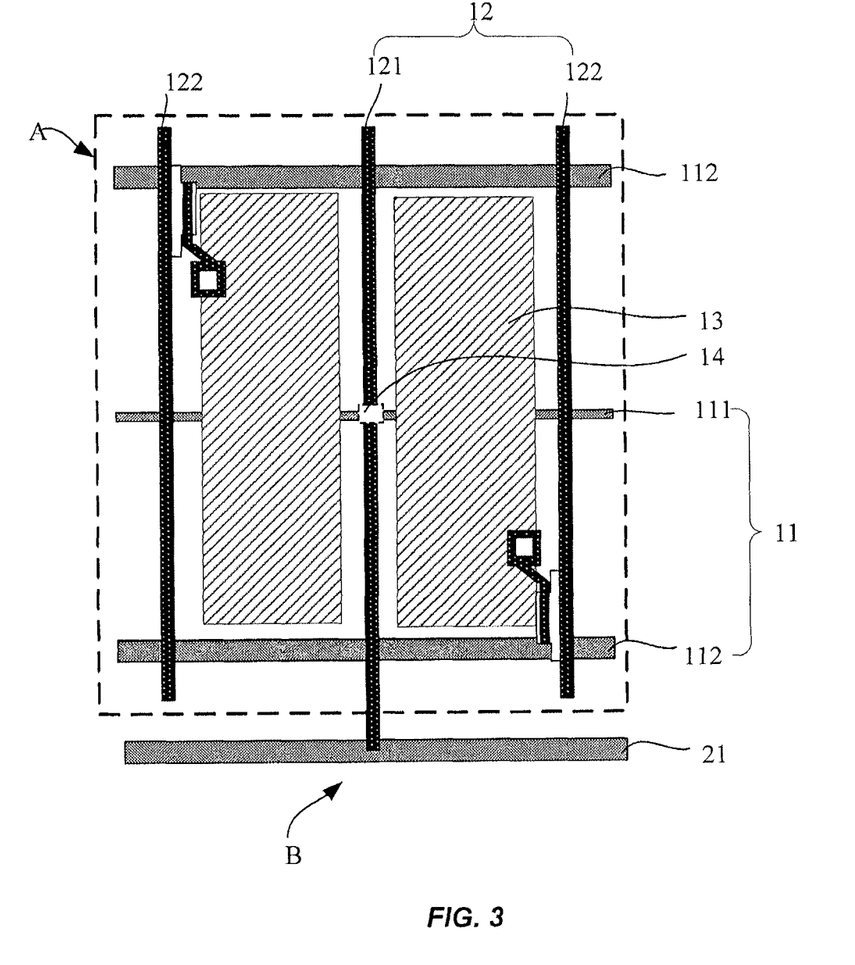
FIG. 3 is a schematic diagram of a structure of a TFT array substrate in still another embodiment of the present invention.

In still another embodiment, the TFT array substrate in the second embodiment is partially modified, the repeated parts will be omitted, and the difference between this embodiment and the second embodiment lies in that, as shown in FIG. 3, the second common electrode line 121 is electrically connected with the third common electrode line 21, but the first common electrode line 111 is not connected with the third common electrode line 21.

Figure 4:
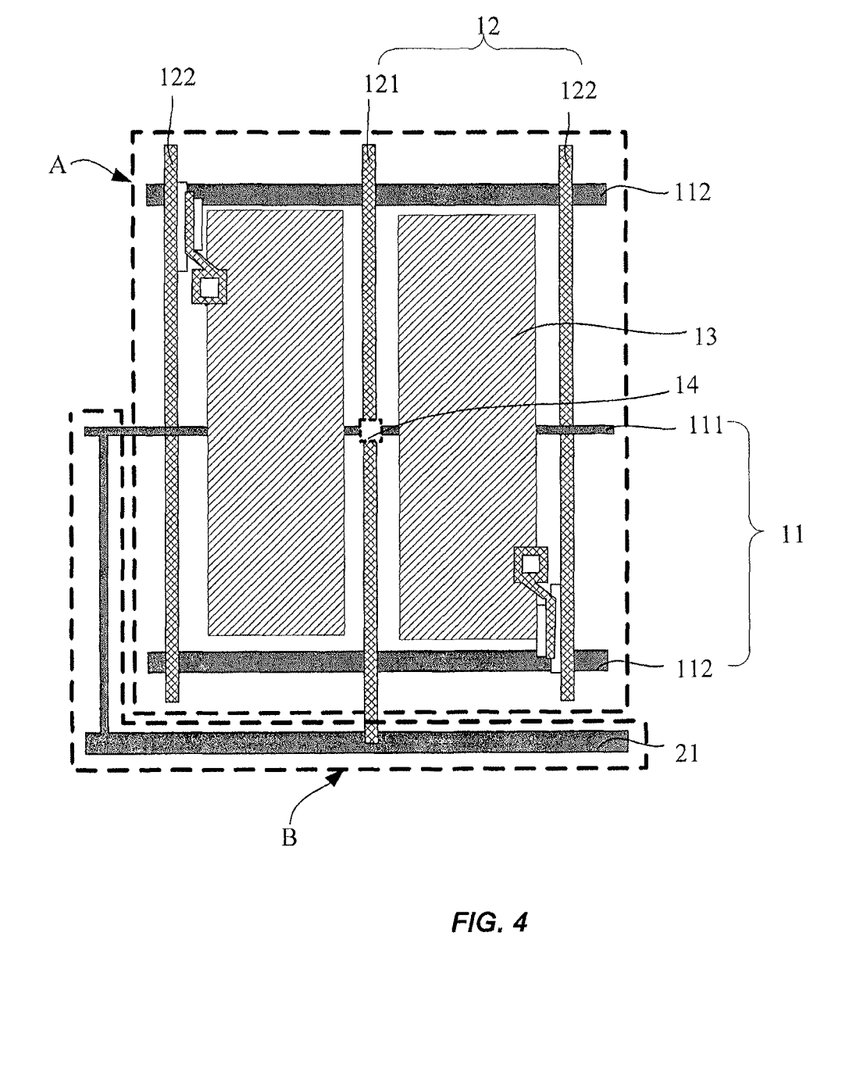
FIG. 4 is a schematic diagram of a structure of a TFT array substrate in further still another embodiment of the present invention.

In further still another embodiment, the TFT array substrate in the second embodiment is partially modified, the repeated parts will be omitted, and the difference between this embodiment and the second embodiment lies in that, as shown in FIG. 4, the third common electrode line 21 is also electrically connected with the second common electrode line 121.

In this embodiment, the first and the second common electrode lines are electrically connected with the third common electrode line 21, thereby capable of better reducing the impedance of the common electrode lines to further alleviate the signal delay of the common electrode lines.

Figure 5A:
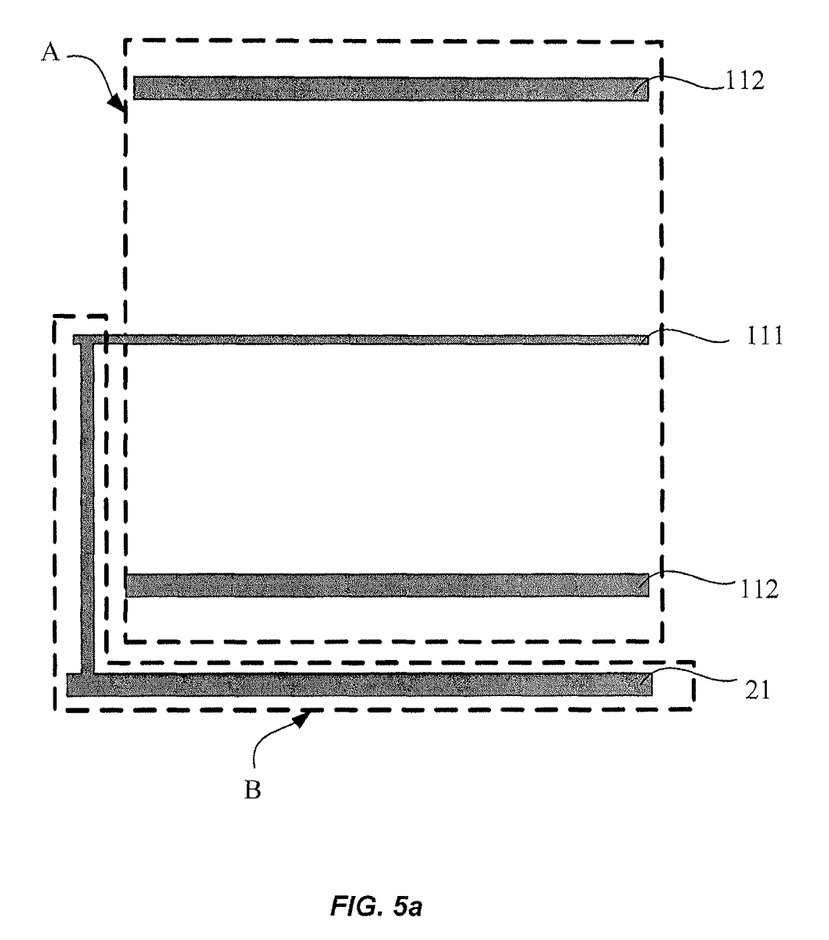
Figure 5B:
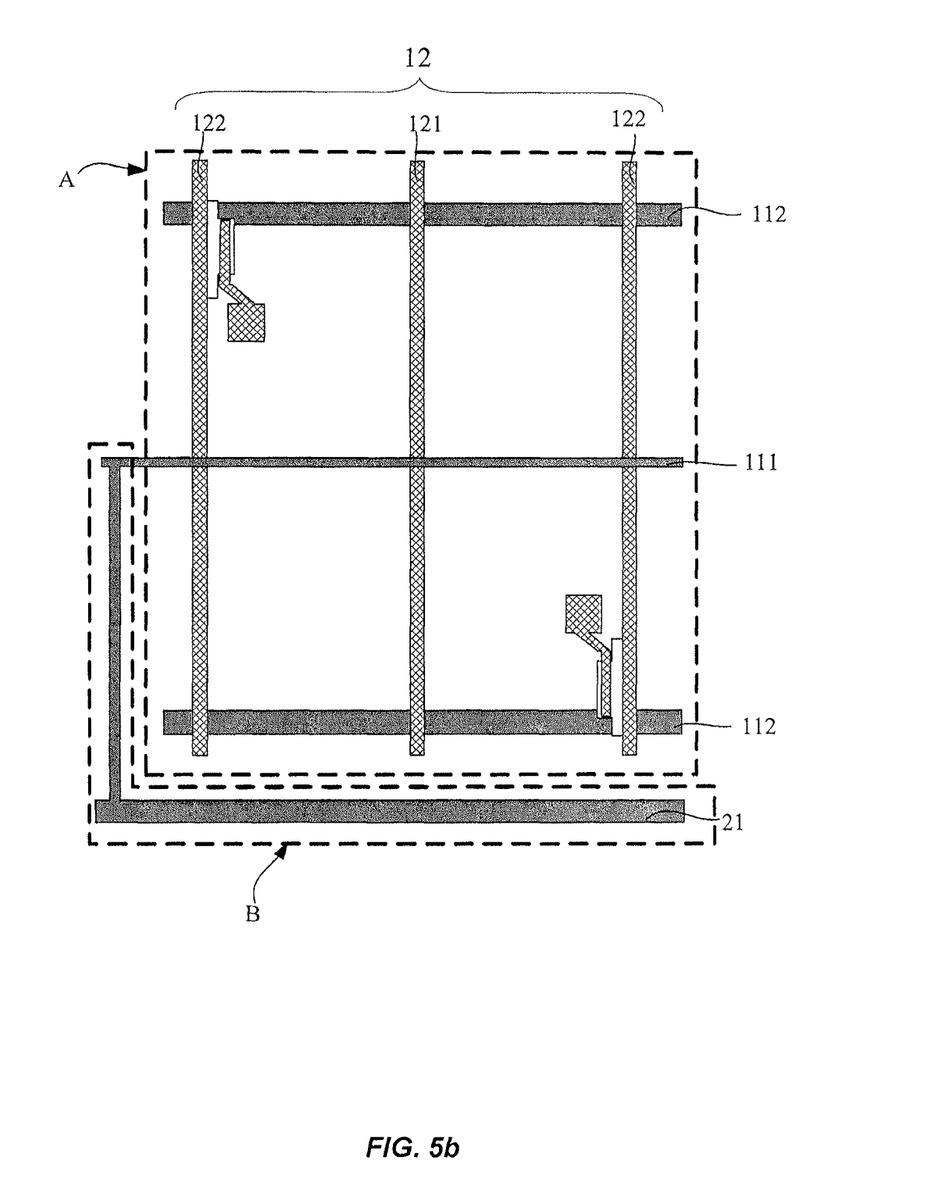
Figure 5C:
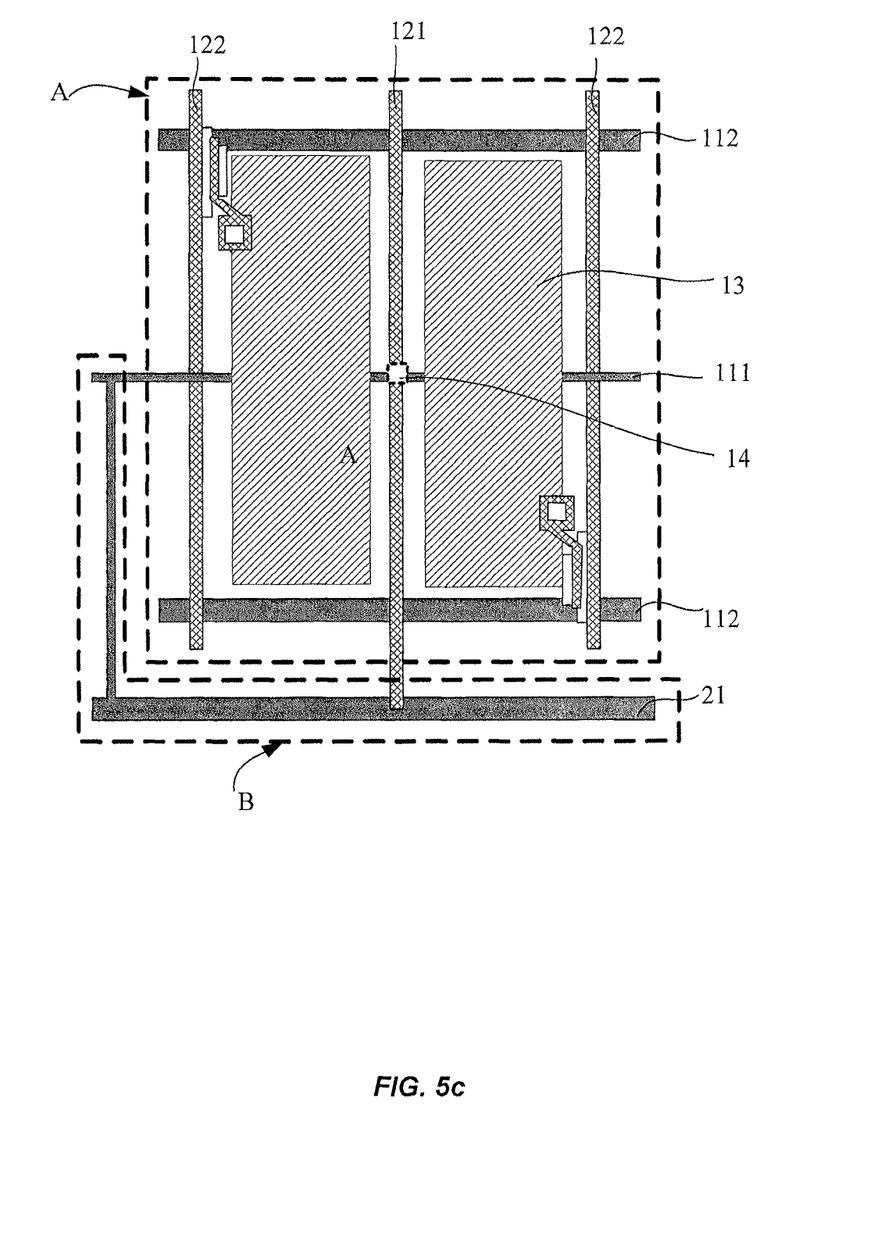

As shown in FIG. 5(*a*) to FIG. 5(*c*), the present invention further provides a manufacturing method of the TFT array substrate. By taking the structure of the fourth embodiments an example, the manufacturing method includes the following steps.

As shown in FIG. 5(*a*), a first metal layer 11 is formed, the first metal layer includes a first common electrode line 111 located in a display area A and a third common electrode line 21 located in a non-display area B.

As shown in FIG. 5(*b*), a second metal layer 12 is formed on the first metal layer 11, and the second metal layer 12 includes a second common electrode line 121.

Generally, the first common electrode line and the third common electrode line 21 are integrally formed and are located in the same layer, but not limited thereto. Actually, the third common electrode line 21 and the second common electrode line can be integrally formed and are located in the same layer.

A further detailed description is made below to the manufacturing method of the TFT provided by the present invention.

As shown in FIG. 5(*a*), the first metal layer 11 is deposited on a substrate (not shown in the figure) in a sputtering or evaporating manner, then, an insulating layer (not shown in the figure) and a photoresist film with a certain thickness (not shown in the figure) are deposited on the first metal layer 11 in a plasma-enhanced chemical vapor deposition manner, and the photoresist film is exposed and developed through a gate mask plate to form a photoresist pattern; and then, the first metal layer 11 is etched to remove the excessive photoresist layer, a gate line 112, a first common electrode line 111 and a third common electrode line 21 are respectively formed, and the gate line 112 is of a double-gate-line structure.

On this basis, as shown in FIG. 5(*b*), a second metal layer 12 with a certain thickness is deposited, a data line 122 and a second common electrode line 121 intersected with the gate line 112 and the first common electrode line 111 are formed through a mask plate of the data line 122, the second common electrode line 121 is vertically intersected with the first common electrode line 111 in an insulated manner, the gate line 112 is separated from the first common electrode line 111, in this embodiment, the first common electrode line 111 is a straight line and is parallel to the gate line 112; the data line 122 is separated from the second common electrode line 121, in this embodiment, the second common electrode line 121 is a straight line and is parallel to the data line 122.

As shown in FIG. 5(*a*) to FIG. 5(*c*), a via hole 14 is formed in the insulating layer, and a pixel electrode 13 is formed on the second common electrode line 121.

Correspondingly, the manufacturing methods in other embodiments are as follows.

The first embodiment provides a TFT array substrate and the fourth embodiment provides a TFT array substrate as well. In the method for manufacturing the TFT array substrate provided in the first embodiment, the method for manufacturing the TFT array substrate provided in the fourth embodiment is partially modified, the repeated parts will be omitted, and the difference between the method for manufacturing the TFT array substrate provided in the first embodiment and the method for manufacturing the TFT array substrate provided in the fourth embodiment lies in that no hole is formed in the insulating layer, namely, the via hole 14 is not formed. Since the first and second common electrode lines are electrically connected with the third common electrode line respectively, the process is simpler and more convenient.

The second embodiment provides a TFT array substrate. In the method for manufacturing the TFT array substrate provided in the second embodiment, the method for manufacturing the TFT array substrate provided in the fourth embodiment is partially modified, the repeated parts will be omitted, and the difference between the method for manufacturing the TFT array substrate provided in the second embodiment and the method for manufacturing the TFT array substrate provided in the fourth embodiment lies in that the second common electrode line 121 is not connected with the third common electrode line 21.

The third embodiment provides a TFT array substrate. In the method for manufacturing the TFT array substrate provided in the third embodiment, the method for manufacturing the TFT array substrate provided in the fourth embodiment is partially modified, the repeated parts will be omitted, and the difference between the method for manufacturing the TFT array substrate provided in the third embodiment and the method for manufacturing the TFT array substrate provided in the fourth embodiment lies in that the first common electrode line 111 is not connected with the third common electrode line 21.

The present invention further provides a display device (not shown in the figures), including a TFT array substrate and a color filter substrate (not shown in the figures) arranged to be opposite to the TFT array substrate, wherein the TFT array substrate is selected from any one of the TFT array substrates in the first embodiment, the second embodiment, the third embodiment and the fourth embodiment, a transparent common electrode (not shown in the figures) is arranged on one side of the color filter substrate, the side of the color filter substrate faces to the TFT array substrate, the transparent common electrode and the pixel electrode form a vertical electric field, for example, a TN type or VA type display device. However, as another preferable embodiment, the TFT array substrate may also include the transparent common electrode to form a transverse electric field with the pixel electrode, for example, an IPS or FFS display device. Generally, the display device is a liquid crystal display device.

It should be noted that:

1. a TFT active layer in the TFT array substrate of the present invention can be amorphous silicon, low temperature polysilicon or metal oxide, and related manufacturing procedure can adopt the known technology in the field, which will be omitted herein.

2. In the present invention, the first common electrode line 111 can be formed by the same mask plate process as the gate line 112, and the first common electrode line 111 can also be formed by a process different from the mask plate process of the gate line 112; the second common electrode line 121 can be formed by the same mask plate process as the data line 122, and the second common electrode line 121 can also be formed by a process different from the mask plate process of the data line 122; and it is merely necessary that the first common electrode line 111 and the gate line 112 are located in the same metal layer and the second common electrode line 121 and the data line 122 are located in the same metal layer.

3. The patterning process of the present invention includes processes such as coating photoresist, exposing through a mask, developing, etching, stripping photoresist and the like, the photoresist is not limited to positive photoresist or negative photoresist, and the positive photoresist is taken as an example in the above embodiments.

In summary, according to the TFT array substrate and the manufacturing method thereof, and the display device including the TFT array substrate of the present invention, the first common electrode line 111 is arranged in the first metal layer 11 (the same layer as the gate line 112), the second common electrode line 121 is arranged in the second metal layer 12 (the same layer as the data line 122), and the double-gate-line structure is adopted, so that a certain number of data lines can be decreased, the second common electrode line 121 is arranged by smartly utilizing the decreased certain number of data lines in the present invention so as not to reduce the aperture ratio, moreover, the delay of the common signal can be avoided by the net-shaped wiring of the first common electrode line 111 and the second common electrode line 121, in the gate line 112 driving process, the TFT array structure can realize current conduction in the longitudinal direction (data line 122 direction) and the transverse direction (gate line 112 direction) so as to at least reduce the delay of the common signal, reduce flicker inequality and crosstalk without reducing the aperture ratio, and improve the display quality. Furthermore, since the cost of the source drive (not shown in the figures) is higher than that of the gate drive (not shown in the figures), and a certain number of data lines is decreased, so that the number of the source drives is correspondingly decreased, and as a result, at least one of the effects of lowering the manufacturing cost and simplifying the process flow can be achieved.

Obviously, various modifications and variations may be made by those skilled in the art without departing from the spirit and scope of the present invention. Thus, the present invention is also intended to encompass these modifications and variations thereto provided that these modifications and variations come into the scope of the claims of the present invention and equivalents thereof.

What is claimed is:

1. A TFT array substrate, including a display area and a non-display area,
   wherein the display area comprises:
   a pixel electrode;
   a first metal layer comprising a first common electrode line and a plurality of gate lines, wherein the gate lines are of a double-gate-line structure, and the first common electrode line is perpendicular to the pixel electrode; and
   a second metal layer comprising a second common electrode line and a plurality of data lines, said second common electrode line is electrically connected to the first common electrode line on the first metal layer, wherein the connecting wiring is shaped as a net in a plane, and the said second common electrode is parallel to the pixel electrode; and
   the non-display area comprising:
   a third common electrode line connected to the first common electrode line and the second common electrode line, wherein same signals are in the first common electrode line, and the second common electrode line, and the third common electrode line, and the third common electrode line is also connected to an external periphery circuit;
   wherein the plurality of gate lines are not directly connected to the first common electrode line, and the data lines are not directly connected to the second common electrode line.

2. The TFT array substrate of claim 1, wherein the first common electrode line and the second common electrode line are straight lines.

3. The TFT array substrate of claim 1, wherein the first common electrode line and the second common electrode line are curved lines.

4. The TFT array substrate of claim 1, further comprising:
   an insulating layer located between the first metal layer and the second metal layer;
   wherein the first and second common electrode lines are electrically connected through a via hole penetrating through the insulating layer.

5. The TFT array substrate of claim 1, further comprising:
   an insulating layer located between the first metal layer and the second metal layer;
   wherein the first and second common electrode lines are electrically connected through a via hole penetrating through the insulating layer.

6. The TFT array substrate of claim 1, wherein the plurality of pixel electrodes are located on the second metal layer.

7. The TFT array substrate of claim 1, wherein the number of pixel electrodes in each row is at least twice as many as the number of the second common electrode lines.

8. A manufacturing method of the TFT array substrate, including:
   forming a plurality of pixel electrodes;
   forming a first metal layer comprising a first common electrode line and a plurality of gate lines, wherein the gate lines are of a double-gate-line structure in a display area, and the first common electrode line is perpendicular to the pixel electrode;
   forming a second metal layer comprising a second common electrode line on the first metal layer and a plurality of data lines, and the second common electrode line is parallel to the pixel electrode, the first common electrode line is electrically connected with the second common electrode line, and the wiring of the second common electrode line and the first common electrode line is shaped as a net on the plane; and
   forming a third common electrode line connected to the first common electrode line and the second common electrode line in a non-display area, wherein a same signal is in the first common electrode line, and the second common electrode line, and the third common electrode line;
   wherein the gate lines are not directly connected from the first common electrode line, and the data lines are not directly connected to the second common electrode line.

9. The manufacturing method of the TFT array substrate of claim 8, wherein an insulating layer is formed between the first metal layer and the second metal layer, and a via hole is formed in the insulating layer.

10. A TFT array substrate, including a display area and a non-display area,
    wherein the display area comprises:
    a pixel electrode;
    a first metal layer comprising a first common electrode line and a plurality of gate lines, wherein the gate lines are of a double-gate-line structure, and the first common electrode line is perpendicular to the pixel electrode;

a second metal layer comprising a second common electrode line and a plurality of data lines, wherein the second common electrode lines are in parallel with the plurality of data lines, wherein the number of the plurality of data lines is reduced at least by the number of the plurality of second common electrode lines; and wherein the non-display area comprises:

a third common electrode line connected to the first common electrode line, the second common electrode line, and an external periphery circuit;

wherein the gate lines are not directly connected to the first common electrode line, and the data lines are not directly connected to the second common electrode line.

11. A TFT array substrate as in claim 10, wherein the second common electrode line on the second metal layer is connected to the first common electrode line on the first metal layer through one via hole.

* * * * *